United States Patent
Hamazaki

(10) Patent No.: US 11,156,518 B2
(45) Date of Patent: Oct. 26, 2021

(54) PRESSURE SENSOR INCLUDING A CONTACT RESTRICTOR

(71) Applicant: Murata Manufacturing Co., Ltd., Nagaokakyo (JP)

(72) Inventor: Ryohei Hamazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/936,458

(22) Filed: Jul. 23, 2020

(65) Prior Publication Data

US 2020/0348197 A1 Nov. 5, 2020

Related U.S. Application Data

(63) Continuation of application No. PCT/JP2019/003364, filed on Jan. 31, 2019.

(30) Foreign Application Priority Data

Mar. 9, 2018 (JP) .............................. JP2018-043268

(51) Int. Cl.
*G01L 9/00* (2006.01)
*G01L 9/12* (2006.01)

(52) U.S. Cl.
CPC .............. *G01L 9/0072* (2013.01); *G01L 9/12* (2013.01)

(58) Field of Classification Search
None
See application file for complete search history.

(56) References Cited

U.S. PATENT DOCUMENTS

| 6,298,730 B1* | 10/2001 | Yamagishi | G01L 19/0084 73/723 |
| 7,360,440 B2* | 4/2008 | Hirose | G01L 1/18 73/777 |
| 11,000,195 B2* | 5/2021 | Joseph | A61B 5/0215 |
| 2005/0183508 A1* | 8/2005 | Sato | G01L 1/142 73/715 |

FOREIGN PATENT DOCUMENTS

| JP | 2005-233877 A | 9/2005 |
| JP | 2015-152450 A | 8/2015 |

OTHER PUBLICATIONS

Official Communication issued in International Patent Application No. PCT/JP2019/003364 dated Feb. 26, 2019.

* cited by examiner

*Primary Examiner* — Lisa M Caputo
*Assistant Examiner* — Nigel H Plumb
(74) *Attorney, Agent, or Firm* — Keating & Bennett, LLP

(57) ABSTRACT

A pressure sensor includes a base, a fixed electrode on the base, a membrane at a distance from and opposite the fixed electrode and having flexibility and conductivity, a dielectric on the fixed electrode and opposite to the membrane, and a contact restrictor to restrict contact between a portion of the dielectric and the membrane by coming in contact with the membrane. A region contactable with the membrane in the dielectric has a shape having an outline including two circular or substantially circular arcs opposite to each other and protruding outward and two circular or substantially circular arcs opposite to each other and protruding inward.

20 Claims, 9 Drawing Sheets

A-A CROSS-SECTIONAL VIEW

B-B CROSS-SECTIONAL VIEW

A-A CROSS-SECTIONAL VIEW

B-B CROSS-SECTIONAL VIEW

PRESSURE SENSOR INCLUDING A CONTACT RESTRICTOR

CROSS REFERENCE TO RELATED APPLICATIONS

This application claims the benefit of priority to Japanese Patent Application No. 2018-043268 filed on Mar. 9, 2018 and is a Continuation Application of PCT Application No. PCT/JP2019/003364 filed on Jan. 31, 2019. The entire contents of each application are hereby incorporated herein by reference.

BACKGROUND OF THE INVENTION

1. Field of the Invention

The present invention relates to a pressure sensor for measuring pressure, such as atmospheric pressure.

2. Description of the Related Art

In related art, as described, for example, in Japanese Unexamined Patent Application Publication No. 2015-152450, there is a touch mode pressure sensor as a capacitive pressure sensor. Such a touch mode pressure sensor includes a fixed electrode, a diaphragm (membrane) that is disposed at a distance from the fixed electrode and sags under pressure, and a dielectric film (dielectric) provided on the fixed electrode and opposite to the membrane. First, when pressure acts on the membrane to cause the membrane to sag, a distance between the fixed electrode and the membrane decreases, and electrostatic capacitance between the fixed electrode and the membrane increases. After the membrane comes in contact with the dielectric, that is, during a touch mode, when an area of contact of the dielectric with the membrane increases, the electrostatic capacitance between the fixed electrode and the membrane increases. The touch mode pressure sensor calculates pressure from an electrostatic capacitance value by using such pressure-capacitance characteristics and outputs a calculated result as a pressure measurement value.

In the case of the pressure sensor described in Japanese Unexamined Patent Application Publication No. 2015-152450, however, after the membrane comes in contact with the dielectric, the linearity of a change in electrostatic capacitance with respect to a change in pressure is low. For this reason, a calculation equation for calculating a pressure measurement value from an electrostatic capacitance value becomes complicated, and calculation accuracy is low. As a result, measurement accuracy of the pressure sensor (pressure calculation accuracy) is low.

SUMMARY OF THE INVENTION

Preferred embodiments of the present invention provide pressure sensors that are each able to provide higher linearity of a change in electrostatic capacitance between a fixed electrode and a membrane with respect to a change in pressure that acts on the membrane and that are able to measure pressure with high accuracy.

A pressure sensor according to a preferred embodiment of the present invention includes a base, a fixed electrode provided on the base, a membrane provided at a distance from and opposite the fixed electrode and having flexibility and conductivity, a dielectric provided on the fixed electrode and being opposite to the membrane, and a contact restrictor configured to restrict contact between a portion of the dielectric and the membrane by coming in contact with the membrane.

In a pressure sensor according to a preferred embodiment of the present invention, a region contactable with the membrane in the dielectric includes a narrow portion that sandwiches a central portion of the dielectric opposite to a central portion of the membrane.

In a pressure sensor according to a preferred embodiment of the present invention, a region contactable with the membrane in the dielectric includes portions that are different in a distance of a straight line from a center to a periphery.

In a pressure sensor according to a preferred embodiment of the present invention, a region contactable with the membrane in the dielectric has an outline including two circular arcs opposite to each other and protruding outward and two circular arcs opposite to each other and protruding inward.

In a pressure sensor according to a preferred embodiment of the present invention, a region contactable with the membrane in the dielectric has an outline including two straight lines opposite and parallel or substantially parallel to each other and two circular arcs opposite to each other and protruding inward.

In a pressure sensor according to a preferred embodiment of the present invention a region contactable with the membrane in the dielectric is substantially cross-shaped.

A pressure sensor according to a preferred embodiment of the present invention includes, as the contact restrictor, a pair of first contact restrictors opposite to each other with the dielectric interposed between the pair of first contact restrictors in a first direction orthogonal or substantially orthogonal to an opposing direction in which the membrane and the dielectric are opposed to each other.

A pressure sensor according to a preferred embodiment of the present invention includes, as the contact restrictor, a pair of second contact restrictors opposite to each other with the dielectric interposed between the pair of second contact restrictors in a second direction orthogonal or substantially orthogonal to the opposing direction and the first direction.

In a pressure sensor according to a preferred embodiment of the present invention, the dielectric has a circular, a substantially circular, a square, a substantially square, a rectangular, or a substantially rectangular shape.

In a pressure sensor according to a preferred embodiment of the present invention, the membrane is provided on the base with a support that supports an outer edge portion of the membrane interposed between the membrane and the base, and the contact restrictor is provided on the support as a protrusion portion protruding inward from the support toward a center of the dielectric.

In a pressure sensor according to a preferred embodiment of the present invention, a pair of the protrusion portions are provided, and the protrusion portions are provided opposite each other with the dielectric interposed between the protrusion portions in a direction orthogonal or substantially orthogonal to an opposing direction in which the membrane and the dielectric are opposed to each other.

Preferred embodiments of the present invention are each able to provide a pressure sensor that is able to provide higher linearity of a change in electrostatic capacitance between the fixed electrode and the membrane with respect to a change in pressure that acts on the membrane and that is able to measure pressure with high accuracy.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

Figure 1:
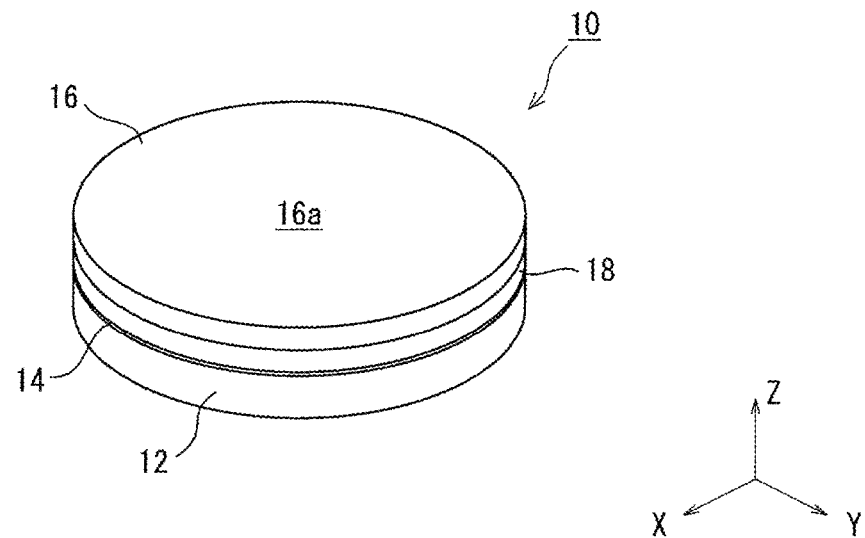
FIG. 1 is a perspective view of a pressure sensor element in a pressure sensor according to a first preferred embodiment of the present invention.
Figure 2:
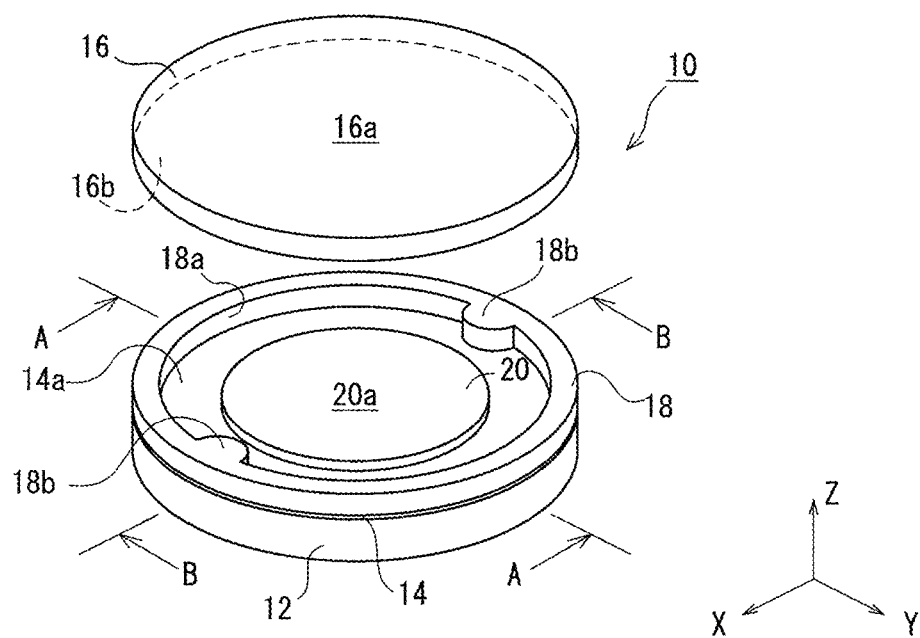
FIG. 2 is a partial exploded perspective view of the pressure sensor element in the pressure sensor according to the first preferred embodiment of the present invention.
Figure 3A:
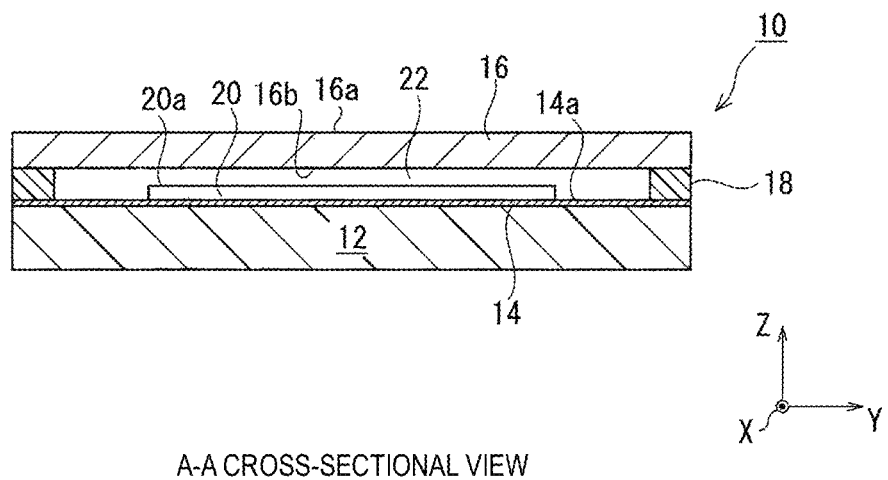
FIG. 3A is a cross-sectional view of the pressure sensor element taken along line A-A in FIG. 2.
Figure 3B:
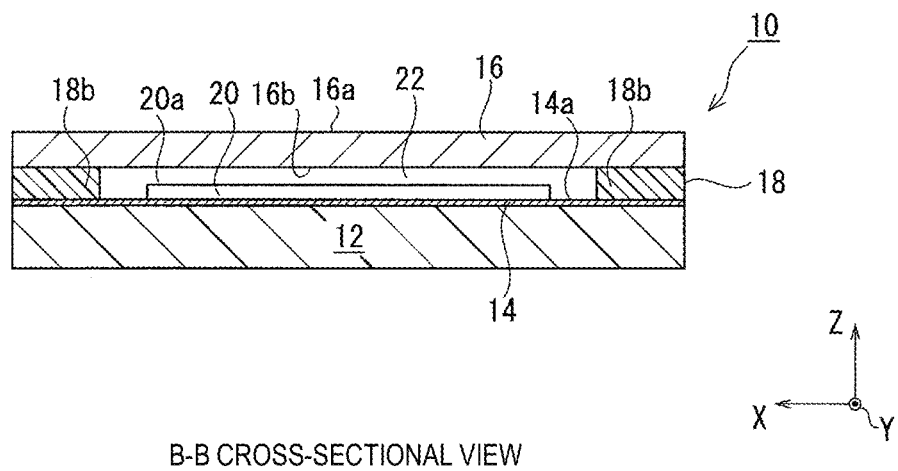
FIG. 3B is a cross-sectional view of the pressure sensor element taken along line B-B in FIG. 2.

FIG. 1 is a perspective view of a pressure sensor element in a pressure sensor according to a first preferred embodiment of the present invention. FIG. 2 is a partial exploded perspective view of the pressure sensor element in the pressure sensor according to the first preferred embodiment. FIG. 3A is a cross-sectional view taken along line A-A in FIG. 2, and FIG. 3B is a cross-sectional view taken along line B-B in FIG. 2. An X-Y-Z orthogonal coordinate system illustrated in each figure is intended to facilitate understanding of the present invention, but is not intended to limit the present invention.

As illustrated in FIGS. 1 and 2, a pressure sensor element 10 according to the present preferred embodiment is a pressure sensor element used in a capacitive pressure sensor, particularly in a touch mode pressure sensor. The pressure sensor element 10 includes a base 12, a fixed electrode 14 provided on the base 12, a conductive membrane 16 disposed at a distance from the fixed electrode 14, a ring-shaped support 18 that supports an outer edge portion of the membrane 16, and a dielectric 20 provided on the fixed electrode 14. In the case of the present preferred embodiment, when viewed from top, that is, when viewed in a Z-axis direction, the pressure sensor element 10 has a circular or substantially circular shape. In other words, the base 12, the fixed electrode 14, the membrane 16, and the support 18 each have a circular or substantially circular shape. The dielectric 20 also has a circular or substantially circular shape.

The base 12 is an insulating substrate made, for example, of an insulating material.

As illustrated in FIGS. 3A and 3B, the fixed electrode 14 is a circular or substantially circular conductor provided on the base 12 and is preferably made, for example, of a conductive polysilicon material. Furthermore, the fixed electrode 14 includes an electrode surface 14a opposite to the membrane 16.

When the membrane 16 is made, for example, of a conductive silicon material, the membrane 16 is a circular or substantially circular conductor having elasticity and conductivity. Furthermore, the membrane 16 includes a pressure receiving surface 16a to be subjected to pressure, and an electrode surface 16b located on a side opposite to the pressure receiving surface 16a and being opposite to the electrode surface 14a of the fixed electrode 14. In the case of the present preferred embodiment, an outer edge portion of the electrode surface 16b of the membrane 16 is supported by the support 18. For this reason, when pressure acts on the pressure receiving surface 16a, a central portion of the membrane 16 other than the outer edge portion sags toward a fixed electrode 14 side, that is, the electrode surface 16b of the membrane 16 approaches the electrode surface 14a of the fixed electrode 14.

The support 18 is a ring-shaped or frame-shaped member made, for example, of an insulating material. In the case of the present preferred embodiment, the support 18 is provided on the base 12 with the fixed electrode 14 interposed between the support 18 and the base 12. In the case of the present preferred embodiment, when the support 18 supports the outer edge portion of the membrane 16 while being interposed between the fixed electrode 14 and the membrane 16, the membrane 16 is disposed at a distance from and opposite to the fixed electrode 14. In other words, as illustrated in FIGS. 3A and 3B, an internal space 22 is defined by the fixed electrode 14, the membrane 16, and the support 18.

The dielectric 20 is made, for example, of a dielectric material and is also a circular or substantially circular film or layer provided on the electrode surface 14a of the fixed electrode 14. Furthermore, the dielectric 20 is disposed on a central portion of the electrode surface 14a of the fixed electrode 14 so as to be surrounded by the support 18, specifically so as to be at an equal or substantially equal distance from an inner wall surface 18a of the support 18. Furthermore, the dielectric 20 includes an opposing surface 20a at a distance from and opposite to the electrode surface 16b of the membrane 16.

Figure 4:
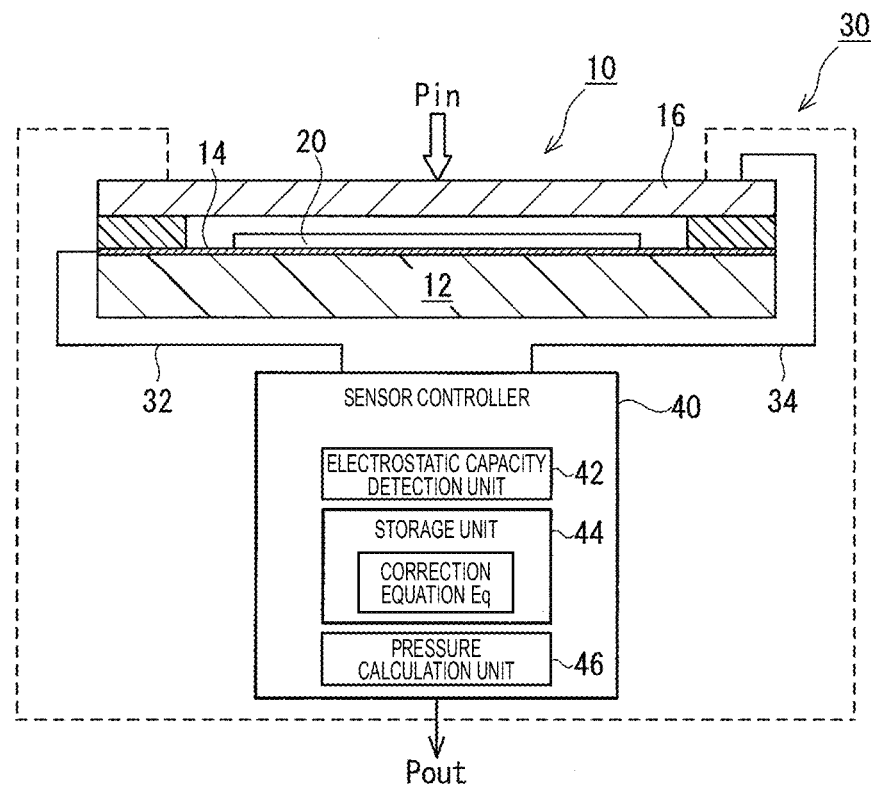
FIG. 4 schematically illustrates a configuration of the pressure sensor according to the first preferred embodiment of the present invention.

FIG. 4 schematically illustrates a configuration of the pressure sensor according to the present preferred embodiment.

As illustrated in FIG. 4, a pressure sensor 30 includes the pressure sensor element 10, and a sensor controller 40.

The fixed electrode 14 in the pressure sensor element 10 is connected to the sensor controller 40 via a fixed electrode line 32. Furthermore, the membrane 16 in the pressure sensor element 10 is connected to the sensor controller 40 via a membrane line 34.

The sensor controller 40 is configured to calculate, as a detection value of pressure to which the pressure receiving surface 16a of the membrane 16 is subjected, an output pressure value Pout in accordance with electrostatic capacitance between the fixed electrode 14 and the membrane 16 in the pressure sensor element 10 and to externally output the calculated output pressure value Pout.

Specifically, the sensor controller 40 includes an electrostatic capacitance detector 42 that detects the electrostatic capacitance between the fixed electrode 14 and the membrane 16. Additionally, the sensor controller 40 includes a storage 44 that stores a correction equation Eq that is a calculation equation to calculate an output pressure value Pout from the electrostatic capacitance detected by the electrostatic capacitance detection unit 42. Furthermore, the sensor controller includes a pressure calculator 46 that calculates an output pressure value Pout by using a value of the electrostatic capacitance detected by the electrostatic capacitance detector 42 and the correction equation Eq stored in the storage 44.

The electrostatic capacitance detector 42 is defined by a capacitor incorporated as a portion of a capacitive sensor or circuit that detects the electrostatic capacitance between the fixed electrode 14 and the membrane 16. The electrostatic capacitance detected by the electrostatic capacitance detector 42 changes in accordance with a change in an actual pressure value Pin that is the pressure to which the pressure receiving surface 16a of the membrane 16 is subjected.

The storage 44 is a storage device, such as a memory, and stores the correction equation Eq (calculation equation) to correct the electrostatic capacitance detected by the electrostatic capacitance detector 42 and calculate an output pressure value Pout. The correction equation Eq to calculate an output pressure value Pout is a function of electrostatic capacitance based on pressure-capacity characteristics of the pressure sensor element 10, for example, a higher-order polynomial.

The pressure calculator 46 is, for example, a processor that acquires the electrostatic capacitance detected by the electrostatic capacitance detector 42 as an electrostatic capacitance signal, that acquires the correction equation Eq from the storage 44 as correction equation data, and that can calculate an output pressure value Pout in accordance with the electrostatic capacitance signal and the correction equation data. The processor calculates an output pressure value Pout, for example, by executing a program, which is stored in the storage 44, to correct the electrostatic capacitance detected by the electrostatic capacitance detector 42 by using the correction equation Eq.

Figure 5:
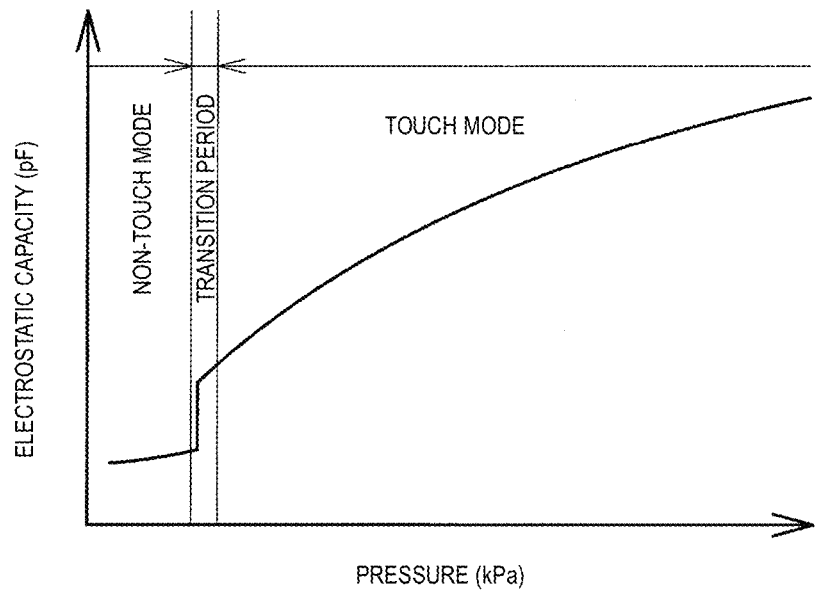
FIG. 5 illustrates pressure-capacitance characteristics of the pressure sensor element included in the pressure sensor according to the first preferred embodiment of the present invention.

FIG. 5 illustrates pressure-capacity characteristics of the pressure sensor element included in the pressure sensor according to the present preferred embodiment. Operation of the pressure sensor 30 will be described with reference to the pressure-capacity characteristics of the pressure sensor element 10 illustrated in FIG. 5.

In the pressure sensor 30, first, when pressure acts on the pressure receiving surface 16a of the membrane 16 in the pressure sensor element 10, the central portion of the membrane 16 other than the outer edge portion sags toward the fixed electrode 14 side, and the central portion of the membrane 16 approaches the fixed electrode 14 side. Thus, a distance between the fixed electrode 14 and the membrane 16 decreases, and the electrostatic capacitance between the fixed electrode 14 and the membrane 16 increases. An operation mode before the electrode surface 16b of the membrane 16 comes in contact with the opposing surface 20a of the dielectric 20 is referred to as a non-touch mode.

When the pressure that acts on the pressure receiving surface 16a of the membrane 16 further increases, a central portion of the electrode surface 16b of the membrane 16 comes in contact with a central portion of the opposing surface 20a of the dielectric 20. When the pressure that acts on the pressure receiving surface 16a of the membrane 16 further increases, the pressure acts on the dielectric 20 through the membrane 16. When the pressure that acts on the pressure receiving surface 16a of the membrane 16 still further increases, an area of a portion of contact between the electrode surface 16b of the membrane 16 and the opposing surface 20a of the dielectric 20, that is, a contact area between the membrane 16 and the dielectric 20 increases. In other words, in the opposing surface 20a of the dielectric 20, a portion that comes in contact with the electrode surface 16b of the membrane 16 spreads outward from a center of the opposing surface 20a. An operation mode in which the contact area between the membrane 16 and the dielectric 20 increases is referred to as a touch mode.

As illustrated in FIG. 5, in the touch mode, higher linearity of a change in electrostatic capacitance between the fixed electrode 14 and the membrane 16 with respect to a change in pressure that acts on the membrane 16 is preferable. In other words, it is preferable that the contact area between the membrane 16 and the dielectric 20 increases in proportion to an increase in pressure that acts on the membrane 16 in the touch mode. This can make the correction equation Eq simpler that is used in calculating an output pressure value Pout from the electrostatic capacitance detected by the electrostatic capacitance detector 42. As a result, the pressure sensor 30 can calculate pressure from the electrostatic capacitance with high accuracy, and the pressure sensor 30 can measure pressure with higher accuracy.

In the present preferred embodiment, as illustrated in FIG. 2, a pair of protrusion portions 18b are provided on the support 18 so that the contact area between the membrane 16 and the dielectric 20 increases in proportion to an increase in pressure that acts on the membrane 16. The pair of protrusion portions 18b are configured to partially restrict deformation of the membrane 16 that sags toward the fixed electrode 14 side under the action of the pressure and restrict contact between a portion of the opposing surface 20a of the dielectric 20 and the electrode surface 16b of the membrane 16 by coming in contact with the membrane 16.

Specifically, each of the protrusion portions 18b of the pair protrudes inward from the inner wall surface 18a of the support 18 toward a center of the dielectric 20. The protrusion portions 18b of the pair are provided opposite to each other with the dielectric 20 interposed therebetween in a direction orthogonal or substantially orthogonal to the Z-axis direction, which is an opposing direction in which the membrane 16 and the dielectric 20 are opposed to each other, that is, in an X-axis direction. Furthermore, tips of the protrusion portions 18b have a circular or substantially circular arc shape when viewed in the Z-axis direction.

When the pair of protrusion portions 18b comes in contact with the membrane 16 that sags under the action of the pressure, contact between a portion of the opposing surface 20a of the dielectric 20 and the electrode surface 16b of the membrane 16 is restricted. Thus, the protrusion portions 18b defines and function as a contact restrictor. This will be specifically described with reference to FIGS. 6A, 6B, and 7.

Figure 6A:
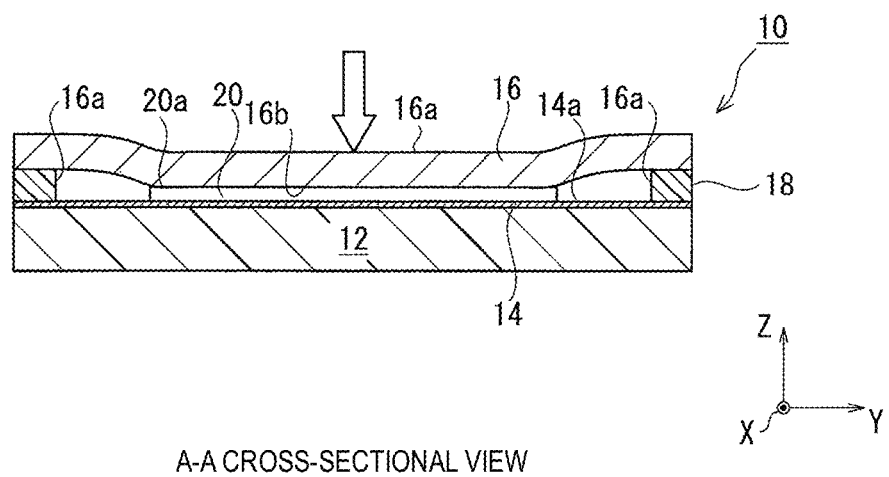
FIG. 6A is a cross-sectional view of the pressure sensor element taken along line A-A in FIG. 2 under the action of pressure.
Figure 6B:
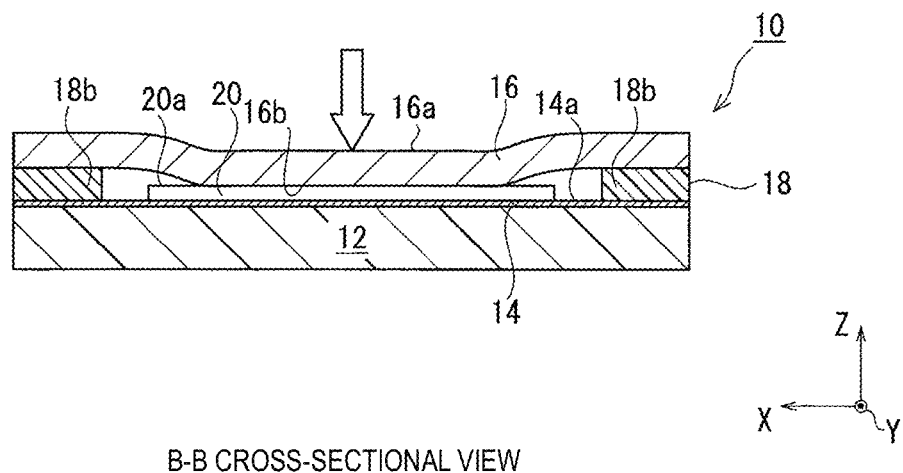
FIG. 6B is a cross-sectional view of the pressure sensor element taken along line B-B in FIG. 2 under the action of pressure.
Figure 7:
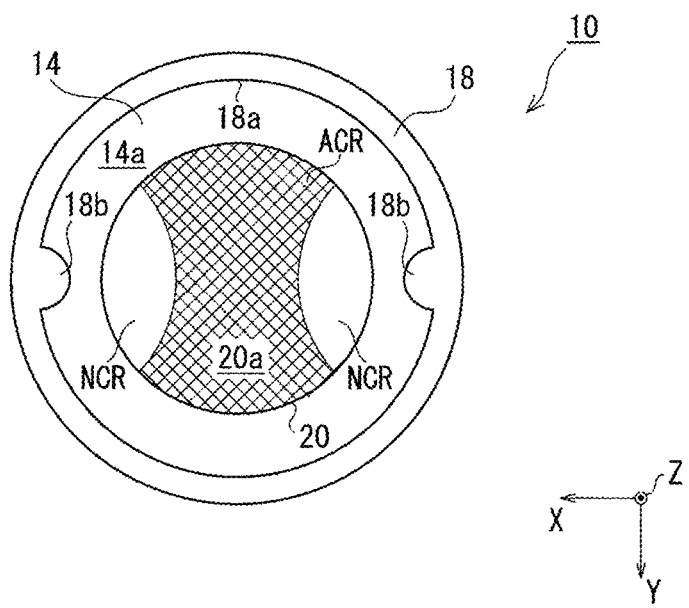
FIG. 7 is a top view illustrating a contactable region where contact between a membrane and a dielectric is possible in the pressure sensor element included in the pressure sensor according to the first preferred embodiment of the present invention.

FIGS. 6A and 6B are each a cross-sectional view of the pressure sensor element 10 under the action of pressure, specifically under the action of an upper measurement limit pressure. FIG. 6A is a cross-sectional view taken along line A-A in FIG. 2, and FIG. 6B is a cross-sectional view taken along line B-B in FIG. 2. FIG. 7 is a top view illustrating a contactable region where contact between the membrane and the dielectric is possible in the pressure sensor element included in the pressure sensor according to the present preferred embodiment. Incidentally, in FIG. 7, a contactable region ACR is represented by cross-hatched lines.

As illustrated in FIG. 6A, in a portion far away from the protrusion portions 18b in the membrane 16, a portion extending from a central portion to portions near the inner wall surface 18a of the support 18 can sag toward the fixed electrode 14 side. Thus, as illustrated in FIG. 7, the electrode surface 16b of the membrane 16 can come in contact with a portion extending from the central portion of the opposing surface 20a of the dielectric 20 to, of an outer edge portion of the opposing surface 20a, portions far away from the protrusion portions 18b.

On the other hand, as illustrated in FIG. 6B, in a portion near the protrusion portions 18b in the membrane 16, portions near the inner wall surface 18a of the support 18 are not able to sag toward the fixed electrode 14 side due to the protrusion portions 18b. For this reason, as illustrated in FIG. 7, the electrode surface 16b of the membrane 16 is not able to come in contact with portions near the protrusion portions 18b in the opposing surface 20a of the dielectric 20. In other words, the electrode surface 16b of the membrane 16 can come in contact with a portion other than the portions near the protrusion portions 18b in the opposing surface 20a of the dielectric 20.

More specifically, as illustrated in FIG. 7, in the opposing surface 20a of the dielectric 20, the contactable region ACR that is contactable with the electrode surface 16b of the membrane 16 and a non-contact region NCR that is not contactable with the electrode surface 16b of the membrane 16 are generated by the pair of protrusion portions 18b. In other words, due to the pair of protrusion portions 18b, the contactable region ACR has a shape including one narrow portion that sandwiches a central portion of the dielectric 20 opposite to the central portion of the membrane 16 when viewed from top, that is, when viewed in the Z-axis direction. Furthermore, the contactable region ACR has a shape having an outline including two circular or substantially circular arcs opposite to each other and protruding outward and two circular or substantially circular arcs opposite to each other and protruding inward when viewed from top, that is, when viewed in the Z-axis direction. Furthermore, the contactable region ACR has a shape including portions that are different in the distance of a straight line from a center to a periphery when viewed from top, that is, when viewed in the Z-axis direction.

Figure 8:
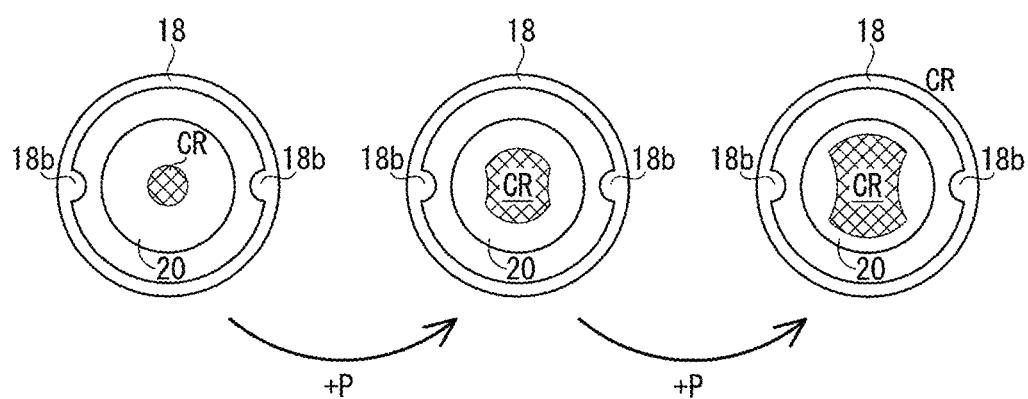
FIG. 8 includes top views illustrating changes in a contact region between the membrane and the dielectric that are caused by increases in pressure that acts on the membrane in the pressure sensor element included in the pressure sensor according to the first preferred embodiment of the present invention.

FIG. 8 includes top views illustrating changes in a contact region between the membrane and the dielectric that are caused by increases in pressure that acts on the membrane in the pressure sensor element included in the pressure sensor according to the present preferred embodiment. Incidentally, in FIG. 8, a contact region CR is represented by cross-hatched lines. As illustrated in FIG. 8, the contact region CR where the opposing surface 20a of the dielectric 20 and the electrode surface 16b of the membrane 16 come in contact with each other enlarges as the pressure that acts on the membrane 16 increases, and the area thereof increases. Then, the contact region CR where the opposing surface 20a of the dielectric 20 and the electrode surface 16b of the membrane 16 come in contact with each other changes from a circular or substantially circular shape to a shape including a narrow portion when viewed from top, that is, when viewed in the Z-axis direction, as the pressure that acts on the membrane 16 increases.

Figure 9:
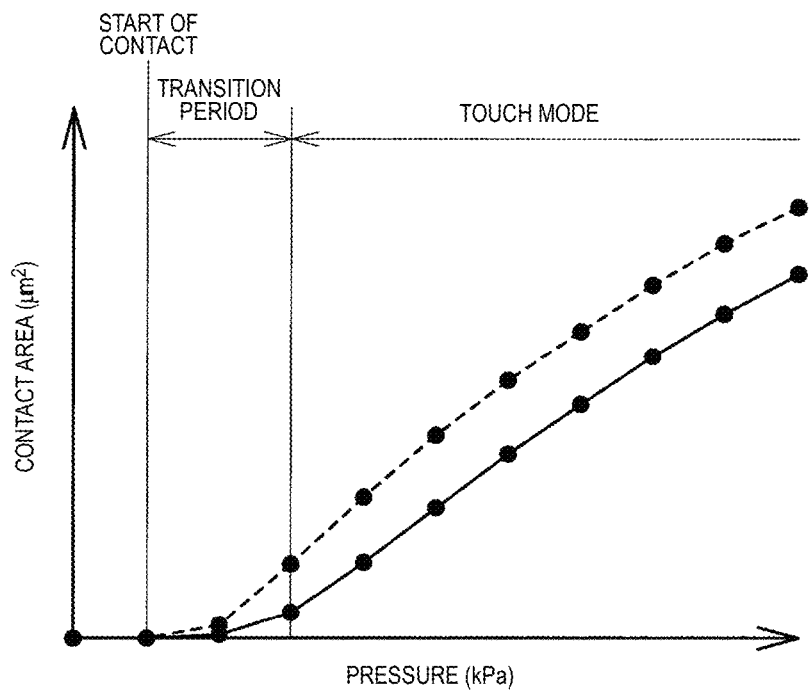
FIG. 9 illustrates a relationship between a change in pressure that acts on the membrane and a change in contact area between the membrane and the dielectric in the pressure sensor element included in the pressure sensor according to the first preferred embodiment of the present invention.

FIG. 9 illustrates a relationship between a change in pressure that acts on the membrane and a change in contact area between the membrane and the dielectric in the pressure sensor element included in the pressure sensor according to the present preferred embodiment. In FIG. 9, a solid line indicates the pressure sensor element 10 according to the present preferred embodiment, and a dashed line indicates a pressure sensor element according to a comparative example. The pressure sensor element according to the comparative example differs from the pressure sensor element 10 according to the present preferred embodiment only in that no pair of protrusion portions are provided on the support to provide a ring-shaped support when viewed in plan.

As illustrated in FIG. 9, in comparison with the pressure sensor element according to the comparative example, in the pressure sensor element 10 according to the present preferred embodiment, the area of the contact region CR, that is, a contact area between the opposing surface 20a of the dielectric 20 and the electrode surface 16b of the membrane 16 increases in proportion to an increase in pressure that acts on the membrane 16.

This will be specifically described. First, in the touch mode, in the pressure sensor element 10, since there is the pair of protrusion portions 18b, the membrane 16 is less likely to sag than that in the pressure sensor element according to the comparative example including no pair of protrusion portions 18b. For this reason, when the same pressure acts on each membrane 16, a contact area in the pressure sensor element 10 is smaller than a contact area in the pressure sensor element according to the comparative example.

Furthermore, regardless of whether or not there is the pair of protrusion portions 18b, in the touch mode, as the pressure that acts on the membrane 16 approaches the upper measurement limit pressure, an increase rate of the contact area, that is, the amount of increase in the contact area per unit pressure decreases. This is because, in the membrane 16, the outer edge portion near the support 18 is less likely to sag than the central portion. In other words, in the membrane 16, the amount by which the central portion sags is larger than the amount by which the outer edge portion sags.

In the pressure sensor element 10 according to the present preferred embodiment, when the pair of protrusion portions 18b are provided, the increase rate of the contact area is lower than that in the pressure sensor element according to the comparative example at a point in time earlier than the pressure that acts on the membrane 16 approaches the upper measurement limit pressure. In other words, as illustrated in FIG. 8, in the pressure sensor element 10 according to the present preferred embodiment, the increase rate of the contact area decreases after the contact region CR begins to change from a circular or substantially circular shape to a shape including a narrow portion when viewed from top, that is, when viewed in the Z-axis direction. As a result, the increase rate of the contact area involved in a change in pressure that acts on the membrane 16 is substantially uniform before the pressure reaches the upper measurement limit pressure, and the contact area thus increases in proportion to an increase in pressure that acts on the membrane 16.

Thus, as illustrated in FIG. 9, in the pressure sensor element 10 according to the present preferred embodiment, when the pair of protrusion portions 18b are provided, the contact area between the membrane 16 and the dielectric 20 increases in proportion to an increase in pressure that acts on the membrane 16 in comparison with the pressure sensor element according to the comparative example in which no pair of protrusion portions are provided. Thus, higher linearity of a change in electrostatic capacitance between the fixed electrode 14 and the membrane 16 with respect to a change in pressure that acts on the membrane 16 can be obtained. As a result, the pressure sensor 30 using this pressure sensor element 10 can measure pressure with high accuracy.

The present preferred embodiment can provide a pressure sensor that provides higher linearity of a change in electrostatic capacitance between a fixed electrode and a membrane with respect to a change in pressure to which the membrane is subjected and that can thus measure pressure with high accuracy.

Although the present invention has been described above with reference to the above-described preferred embodiments, preferred embodiments of the present invention are not limited to the above-described preferred embodiment.

For example, in the case of the above-described preferred embodiment, as illustrated in FIGS. 1 and 2, the pressure sensor element 10 has a circular or substantially circular shape when viewed in the opposing direction in which the membrane 16 and the dielectric 20 are opposed to each other, that is, when viewed in the Z-axis direction. Furthermore, the dielectric 20 also has a circular or substantially circular shape when viewed in the Z-axis direction. However, preferred embodiments of the present invention are not limited to this.

Figure 10A:
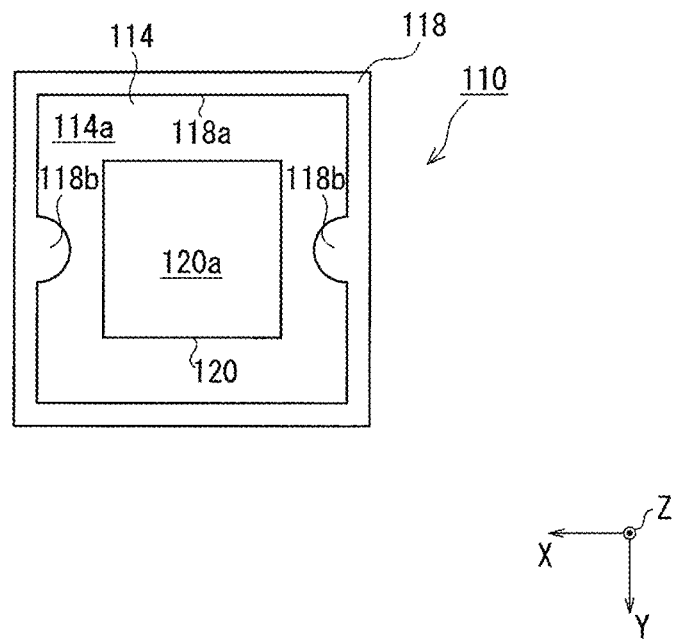
FIG. 10A is a top view of a pressure sensor element included in a pressure sensor according to a second preferred embodiment of the present invention with a membrane removed.

FIG. 10A is a top view of a pressure sensor element included in a pressure sensor according to a second preferred embodiment of the present invention with a membrane removed.

As illustrated in FIG. 10A, a pressure sensor element 110 according to the second preferred embodiment is rectangular or substantially rectangular, and particularly has a square or substantially square shape when viewed in an opposing direction in which the membrane, which is not illustrated, and a dielectric 120 are opposed to each other, that is, when viewed in the Z-axis direction. The dielectric 120 also has a square or substantially square shape when viewed in the Z-axis direction.

Figure 10B:
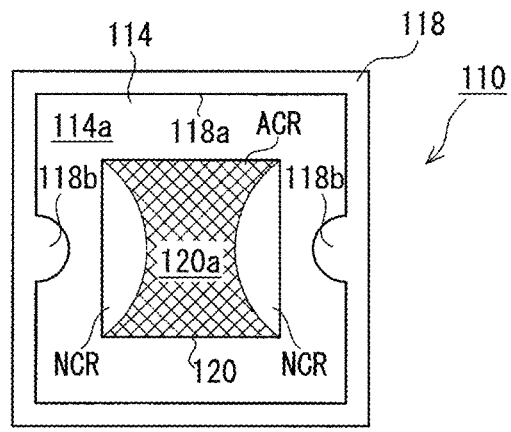
FIG. 10B is a top view illustrating a contactable region where contact between the membrane and a dielectric is possible in the pressure sensor element included in the pressure sensor according to the second preferred embodiment of the present invention.

Furthermore, in the pressure sensor element 110, a pair of protrusion portions 118b are provided on a support 118. Each of the protrusion portions 118b of the pair protrudes inward from an inner wall surface 118a of the support 118 toward a center of the dielectric 120. The protrusion portions 118b of the pair are provided opposite each other with the dielectric 120 interposed therebetween in a direction orthogonal or substantially orthogonal to the Z-axis direction, which is the opposing direction in which the membrane and the dielectric 120 are opposed to each other, that is, in the X-axis direction. Furthermore, tips of the protrusion portions 118b have a circular or substantially circular arc shape when viewed in the Z-axis direction. FIG. 10B is a top view illustrating a contactable region where contact between the membrane and the dielectric is possible in the pressure sensor element included in the pressure sensor according to the present preferred embodiment. In FIG. 10B, a contactable region ACR is represented by cross-hatched lines. As illustrated in FIG. 10B, in an opposing surface 120a of the dielectric 120, the contactable region ACR that is contactable with an electrode surface of the membrane and a non-contact region NCR that is not contactable with the electrode surface of the membrane are generated by the pair of protrusion portions 118b. In other words, due to the pair of protrusion portions 118b, the contactable region ACR has a shape including one narrow portion that sandwiches a central portion of the dielectric 120 opposite to a central portion of the membrane when viewed from top, that is, when viewed in the Z-axis direction. Furthermore, the contactable region ACR has a shape having an outline including two straight lines opposite and parallel or substantially parallel to each other and two circular or substantially circular arcs opposite to each other and protruding inward when viewed from top, that is, when viewed in the Z-axis direction. Furthermore, the contactable region ACR has a shape including portions that are different in the distance of a straight line from a center to a periphery when viewed from top, that is, when viewed in the Z-axis direction.

In this pressure sensor element 110 as well as in the pressure sensor element 10 according to the first preferred embodiment, when the pair of protrusion portions 118b is provided, higher linearity of a change in electrostatic capacitance between a fixed electrode 114 and the membrane with respect to a change in pressure that acts on the membrane can be obtained. Thus, the pressure sensor using the pressure sensor element 110 can measure pressure with high accuracy.

Figure 11A:
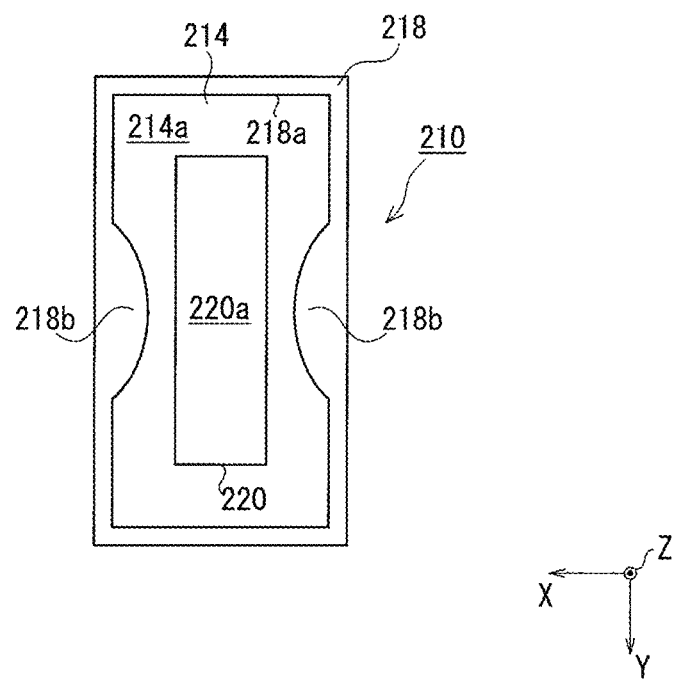
FIG. 11A is a top view of a pressure sensor element included in a pressure sensor according to a third preferred embodiment of the present invention with a membrane removed.
Figure 11B:
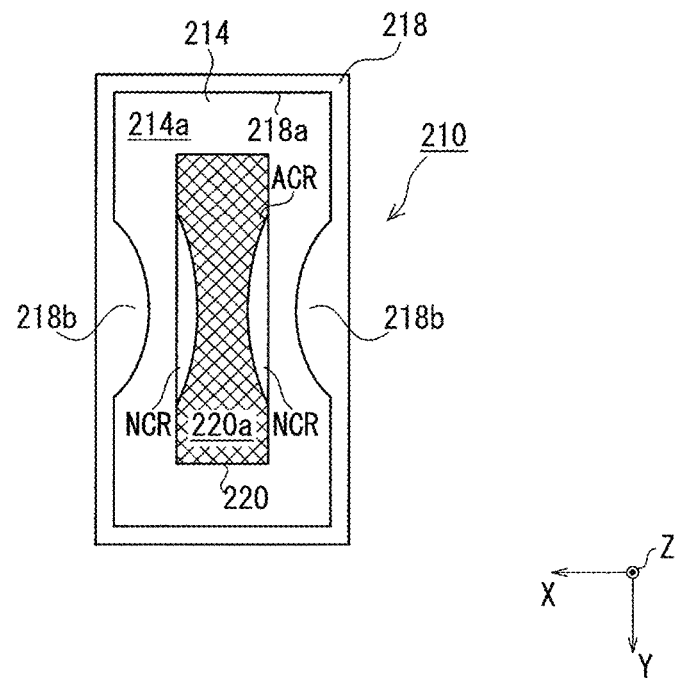
FIG. 11B is a top view illustrating a contactable region where contact between the membrane and a dielectric is possible in the pressure sensor element included in the pressure sensor according to the third preferred embodiment of the present invention.

However, preferred embodiments of the present invention are not limited to this. FIG. 11A is a top view of a pressure sensor element included in a pressure sensor according to a third preferred embodiment of the present invention with a membrane removed. As illustrated in FIG. 11A, a pressure sensor element 210 according to the third preferred embodiment has a rectangular or substantially rectangular shape when viewed in an opposing direction in which the membrane, which is not illustrated, and a dielectric 220 are opposed to each other, that is, when viewed in the Z-axis direction. The dielectric 220 also has a rectangular or substantially rectangular shape when viewed in the Z-axis direction. FIG. 11B is a top view illustrating a contactable region where contact between the membrane and the dielectric is possible in the pressure sensor element included in the pressure sensor according to the present preferred embodiment. In FIG. 11B, a contactable region ACR is represented by cross-hatched lines. As illustrated in FIGS. 11A and 11B, in this pressure sensor element 210 as well as in the pressure sensor element 110 according to the above-described second preferred embodiment, when a pair of protrusion portions 218b are provided, higher linearity of a change in electrostatic capacitance between a fixed electrode 214 and the membrane with respect to a change in pressure that acts on the membrane can be obtained. Thus, the pressure sensor using the pressure sensor element 210 can measure pressure with high accuracy.

Figure 12A:
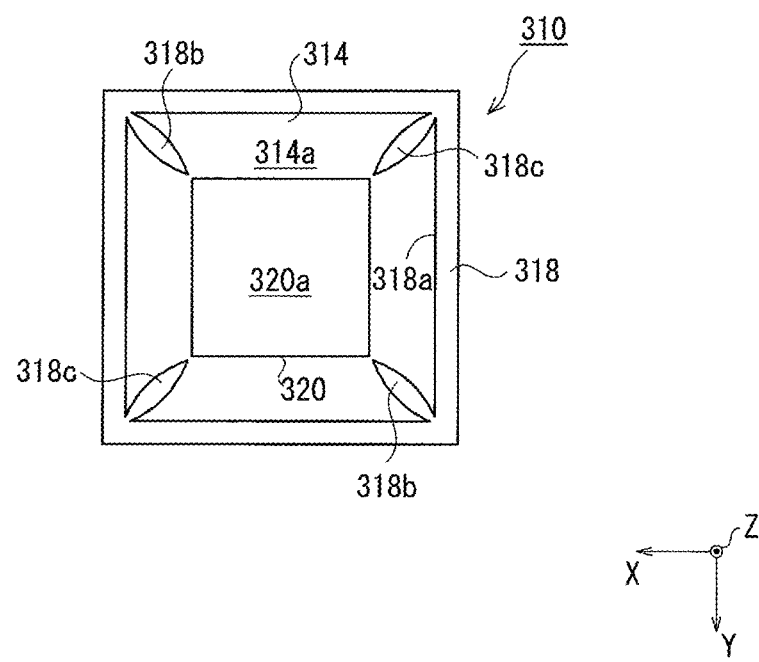
FIG. 12A is a top view of a pressure sensor element included in a pressure sensor according to a fourth preferred embodiment of the present invention with a membrane removed.

FIG. 12A is a top view of a pressure sensor element included in a pressure sensor according to a fourth preferred embodiment of the present invention with a membrane removed.

As illustrated in FIG. 12A, a pressure sensor element 310 according to the fourth preferred embodiment has a square or substantially square shape when viewed in an opposing direction in which the membrane, which is not illustrated, and a dielectric 320 are opposed to each other, that is, when viewed in the Z-axis direction. The dielectric 320 also has a square or substantially square shape when viewed in the Z-axis direction.

Furthermore, in the pressure sensor element 310, two pairs of protrusion portions 318b and 318c are provided on a support 318. Each of the protrusion portions 318b and 318c of the two pairs protrudes inward from an inner wall surface 318a of the support 318 toward a center of the dielectric 320. The protrusion portions 318b of one pair, which are first contact restrictors, are provided opposite each other with the dielectric 320 interposed therebetween in a first direction orthogonal or substantially orthogonal to the Z-axis direction, which is the opposing direction in which the membrane and the dielectric 320 are opposed to each other. Specifically, the first direction is one of diagonal directions in the dielectric 320 that has a square or substantially square shape when viewed in the Z-axis direction.

The protrusion portions 318c of the other pair, which are second contact restrictors, are provided opposite each other with the dielectric 320 interposed therebetween in a second direction that is orthogonal or substantially orthogonal to the Z-axis direction, which is the opposing direction in which the membrane and the dielectric 320 are opposed to each other, and orthogonal or substantially orthogonal to the first direction, which is an opposing direction in which the protrusion portions 318b of the one pair are opposed to each other. Specifically, the second direction is the other of the diagonal directions in the dielectric 320 that has a square or substantially square shape when viewed in the Z-axis direction.

Figure 12B:
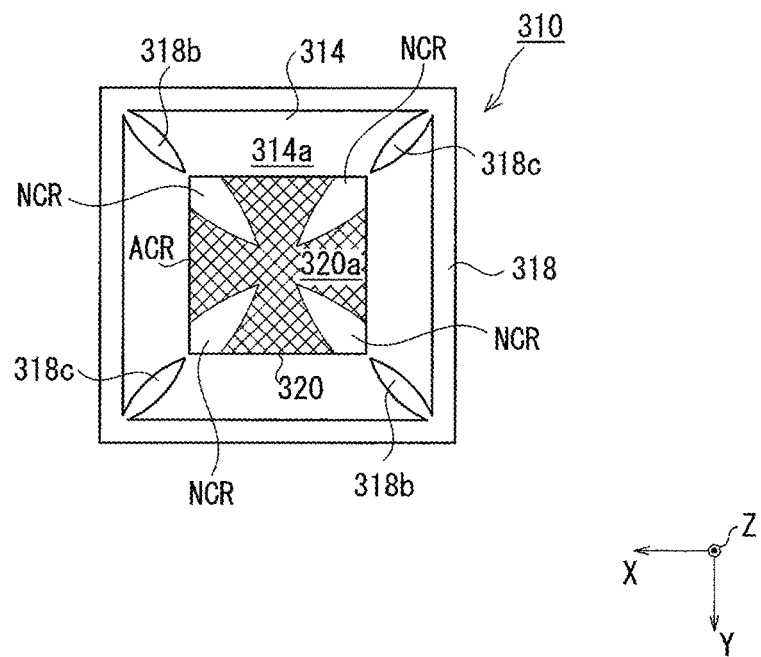
FIG. 12B is a top view illustrating a contactable region where contact between the membrane and a dielectric is possible in the pressure sensor element included in the pressure sensor according to the fourth preferred embodiment of the present invention.

FIG. 12B is a top view illustrating a contactable region where contact between the membrane and the dielectric is possible in the pressure sensor element included in the pressure sensor according to the present preferred embodiment. In in FIG. 12B, a contactable region ACR is represented by cross-hatched lines. As illustrated in FIG. 12B, in an opposing surface 320a of the dielectric 320, the contactable region ACR that is contactable with an electrode surface of the membrane and a non-contact region NCR that is not contactable with the electrode surface of the membrane are generated by the one pair of protrusion portions 318b and the other pair of protrusion portions 318c. In other words, due to the one pair of protrusion portions 318b and the other pair of protrusion portions 318c, the contactable region ACR has a shape including two narrow portions that each sandwich a central portion of the dielectric 320 opposite to a central portion of the membrane and that are provided in directions orthogonal or substantially orthogonal to each other when viewed from top, that is, when viewed in the Z-axis direction. In other words, when viewed from top, that is, when viewed in the Z-axis direction, the contactable region ACR has a shape in which two shapes each having an outline including two straight lines opposite and parallel or substantially parallel to each other and two circular or substantially circular arcs opposite to each other and protruding inward overlap each other in the directions orthogonal or substantially orthogonal to each other, that is, the contactable region ACR is substantially cross-shaped. Furthermore, the contactable region ACR has a shape including portions that are different in the distance of a straight line from a center to a periphery when viewed from top, that is, when viewed in the Z-axis direction.

In the pressure sensor element 310 as well as in the pressure sensor element 10 according to the above-described first preferred embodiment, higher linearity of a change in electrostatic capacitance between a fixed electrode 314 and the membrane with respect to a change in pressure that acts on the membrane can be obtained. Thus, the pressure sensor using the pressure sensor element 310 can measure pressure with high accuracy.

Furthermore, in the case of the above-described first preferred embodiment, as illustrated in FIG. 2, the pair of protrusion portions 18b provided on the support 18 interposed between the fixed electrode 14 and the membrane 16 is a contact restrictor to restrict contact between a portion of the opposing surface 20a of the dielectric 20 and the electrode surface 16b of the membrane 16 by coming in contact with the membrane 16 that sags under the action of pressure. However, preferred embodiments of the present invention are not limited to this. For example, a contact restrictor may be another member different from a support. Furthermore, the contact restrictor may be disposed between a membrane and a dielectric.

Additionally, in the case of the above-described first preferred embodiment, as illustrated in FIG. 2, the dielectric 20 is provided on the central portion of the electrode surface 14a of the fixed electrode 14. In other words, the area of the dielectric 20 is smaller than the area of the fixed electrode 14 when viewed in the opposing direction in which the membrane 16 and the dielectric 20 are opposed to each other, that is, when viewed in the Z-axis direction. However, preferred embodiments of the present invention are not limited to this. A dielectric may have the same area as a fixed electrode when viewed in an opposing direction in which a membrane and the dielectric are opposed to each other.

A pressure sensor according to a preferred embodiment of the present invention is, in a broad sense, a pressure sensor including a base, a fixed electrode provided on the base, a membrane provided at a distance from and opposite the fixed electrode and having flexibility and conductivity, a dielectric provided on the fixed electrode and being opposite to the membrane, and a contact restrictor to restrict contact between a portion of the dielectric and the membrane by coming in contact with the membrane.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A pressure sensor comprising:
   a base;
   a fixed electrode provided on the base;
   a membrane provided at a distance from and opposite to the fixed electrode and having flexibility and conductivity;
   a dielectric provided on the fixed electrode and opposite to the membrane; and
   a contact restrictor to restrict contact between a portion of the dielectric and the membrane by coming in contact with the membrane; wherein
   a region contactable with the membrane in the dielectric has a shape having an outline including two circular or substantially circular arcs opposite to each other and protruding outward and two circular or substantially circular arcs opposite to each other and protruding inward.

2. The pressure sensor according to claim 1, wherein the pressure sensor includes, as the contact restrictor, a pair of first contact restrictors opposite to each other with the dielectric interposed between the pair of first contact restrictors in a first direction orthogonal or substantially orthogonal to an opposing direction in which the membrane and the dielectric are opposed to each other.

3. The pressure sensor according to claim 1, wherein the dielectric has one of a circular, a substantially circular, a square, a substantially square, a rectangular, and a substantially rectangular shape.

4. The pressure sensor according to claim 1, wherein
   the membrane is provided on the base with a support that supports an outer edge portion of the membrane interposed between the membrane and the base; and
   the contact restrictor is provided on the support as a protrusion portion protruding inward from the support toward a center of the dielectric.

5. The pressure sensor according to claim 4, wherein a pair of the protrusion portions are provided opposite each other with the dielectric interposed between the protrusion portions in a direction orthogonal or substantially orthogonal to an opposing direction in which the membrane and the dielectric are opposed to each other.

6. A pressure sensor comprising:
   a base;
   a fixed electrode provided on the base;
   a membrane provided at a distance from and opposite to the fixed electrode and having flexibility and conductivity;
   a dielectric provided on the fixed electrode and opposite to the membrane; and
   a contact restrictor to restrict contact between a portion of the dielectric and the membrane by coming in contact with the membrane; wherein
   a region contactable with the membrane in the dielectric has a shape having an outline including two straight lines opposite and parallel or substantially parallel to each other and two circular or substantially circular arcs opposite to each other and protruding inward.

7. The pressure sensor according to claim 6, wherein the pressure sensor includes, as the contact restrictor, a pair of first contact restrictors opposite to each other with the dielectric interposed between the pair of first contact restrictors in a first direction orthogonal or substantially orthogonal to an opposing direction in which the membrane and the dielectric are opposed to each other.

8. The pressure sensor according to claim 6, wherein the dielectric has one of a circular, a substantially circular, a square, a substantially square, a rectangular, and a substantially rectangular shape.

9. The pressure sensor according to claim 6, wherein
   the membrane is provided on the base with a support that supports an outer edge portion of the membrane interposed between the membrane and the base; and
   the contact restrictor is provided on the support as a protrusion portion protruding inward from the support toward a center of the dielectric.

10. The pressure sensor according to claim 9, wherein a pair of the protrusion portions are provided opposite each other with the dielectric interposed between the protrusion portions in a direction orthogonal or substantially orthogonal to an opposing direction in which the membrane and the dielectric are opposed to each other.

11. A pressure sensor comprising:
    a base;
    a fixed electrode provided on the base;
    a membrane provided at a distance from and opposite to the fixed electrode and having flexibility and conductivity;
    a dielectric provided on the fixed electrode and opposite to the membrane; and
    a contact restrictor to restrict contact between a portion of the dielectric and the membrane by coming in contact with the membrane; wherein
    a region contactable with the membrane in the dielectric is substantially cross-shaped.

12. The pressure sensor according to claim 11, wherein
    the pressure sensor includes, as the contact restrictor, a pair of first contact restrictors opposite to each other with the dielectric interposed between the pair of first contact restrictors in a first direction orthogonal or substantially orthogonal to an opposing direction in which the membrane and the dielectric are opposed to each other; and
    the pressure sensor includes, as the contact restrictor, a pair of second contact restrictors opposite to each other with the dielectric interposed between the pair of second contact restrictors in a second direction orthogonal or substantially orthogonal to the opposing direction and the first direction.

13. The pressure sensor according to claim 11, wherein the dielectric has one of a circular, a substantially circular, a square, a substantially square, a rectangular, and a substantially rectangular shape.

14. The pressure sensor according to claim 11, wherein
    the membrane is provided on the base with a support that supports an outer edge portion of the membrane interposed between the membrane and the base; and
    the contact restrictor is provided on the support as a protrusion portion protruding inward from the support toward a center of the dielectric.

15. The pressure sensor according to claim 14, wherein a pair of the protrusion portions are provided opposite each other with the dielectric interposed between the protrusion portions in a direction orthogonal or substantially orthogonal to an opposing direction in which the membrane and the dielectric are opposed to each other.

16. A pressure sensor comprising:
    a base;
    a fixed electrode provided on the base;
    a membrane provided at a distance from and opposite to the fixed electrode and having flexibility and conductivity;

a dielectric provided on the fixed electrode and opposite to the membrane; and
a contact restrictor to restrict contact between a portion of the dielectric and the membrane by coming in contact with the membrane; wherein
the fixed electrode is a circular or substantially circular conductor; and
the fixed electrode is made of a conductive polysilicon materials.

17. A pressure sensor comprising:
a base;
a fixed electrode provided on the base;
a membrane provided at a distance from and opposite to the fixed electrode and having flexibility and conductivity;
a dielectric provided on the fixed electrode and opposite to the membrane; and
a contact restrictor to restrict contact between a portion of the dielectric and the membrane by coming in contact with the membrane; wherein
the membrane is a circular or substantially circular conductor; and
the membrane is made of a conductive silicon material.

18. A pressure sensor comprising:
a base;
a fixed electrode provided on the base;
a membrane provided at a distance from and opposite to the fixed electrode and having flexibility and conductivity;
a dielectric provided on the fixed electrode and opposite to the membrane;
a contact restrictor to restrict contact between a portion of the dielectric and the membrane by coming in contact with the membrane; and
a sensor controller connected to the fixed electrode via a fixed electrode line.

19. The pressure sensor according to claim 18, wherein the sensor controller includes:
an electrostatic capacitance detector that detects electrostatic capacitance between the fixed electrode and the membrane;
a storage that stores a correction equation to calculate an output pressure value from the electrostatic capacitance detected by the electrostatic capacitance detector; and
a pressure calculator that calculates the output pressure value using a value of the electrostatic capacitance detected by the electrostatic capacitance detector and the correction equation stored in the storage.

20. The pressure sensor according to claim 19, wherein the pressure calculator is a processor that acquires the electrostatic capacitance detected by the electrostatic capacitance detector as an electrostatic capacitance signal, acquires the correction equation from the storage as correction equation data, and calculates an output pressure value in accordance with the electrostatic capacitance signal and the correction equation data.

* * * * *